(12) United States Patent
Juskey et al.

(10) Patent No.: US 6,356,453 B1
(45) Date of Patent: Mar. 12, 2002

(54) ELECTRONIC PACKAGE HAVING FLIP CHIP INTEGRATED CIRCUIT AND PASSIVE CHIP COMPONENT

(75) Inventors: Frank Juskey; Christopher Scanlan, both of Phoenix, AZ (US); Pat O'Brien, Muntinlupa (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/608,678

(22) Filed: Jun. 29, 2000

(51) Int. Cl.[7] .................................................. H05K 7/06
(52) U.S. Cl. ........................ 361/760; 361/782; 361/783; 361/784; 257/724; 257/728; 257/737; 257/778; 257/787
(58) Field of Search ................................ 361/760, 782, 361/783, 784; 257/700, 723, 724, 728, 737, 738, 778, 787; 29/840, 841; 228/180.21, 180.22; 438/108, 126, 127

(56) References Cited

U.S. PATENT DOCUMENTS

| 5,471,027 A | * | 11/1995 | Call et al. ..................... 29/841 |
| 5,608,262 A | * | 3/1997 | Degani et al. ............... 257/723 |
| 5,708,296 A | * | 1/1998 | Bhansali ...................... 257/700 |
| 5,757,074 A | * | 5/1998 | Matloubian et al. ........ 257/728 |
| 5,784,261 A | * | 7/1998 | Pedder ........................ 361/783 |
| 5,812,380 A | * | 9/1998 | Frech et al. ................. 361/794 |
| 5,883,425 A | * | 3/1999 | Kobayashi ................... 257/723 |
| 5,907,477 A | * | 5/1999 | Tuttle et al. ................. 361/760 |
| 5,962,133 A | * | 10/1999 | Yamaguchi et al. ... 228/180.21 |
| 5,981,314 A | | 11/1999 | Glenn et al. ................. 438/127 |
| 6,061,248 A | * | 5/2000 | Otani et al. .................. 257/778 |
| 6,093,972 A | * | 7/2000 | Carney et al. ............... 257/778 |
| 6,108,210 A | * | 8/2000 | Chung ......................... 361/760 |
| 6,218,730 B1 | * | 4/2001 | Toy et al. .................... 257/778 |
| 6,235,996 B1 | * | 5/2001 | Farooq et al. ............... 257/737 |
| 6,241,145 B1 | * | 6/2001 | Maeda et al. .......... 228/180.22 |

* cited by examiner

Primary Examiner—Jeffrey Gaffin
Assistant Examiner—John B. Vigushin
(74) Attorney, Agent, or Firm—Gunnison, McKay & Hodgson, L.L.P.; Serge J. Hodgson

(57) ABSTRACT

A package includes both a flip chip mounted active Chip component and a passive chip component. The flip chip bumps between the bond pads of the active chip component and the substrate are low impedance. Further, by mounting the active chip component as a flip chip, the area on the substrate occupied by the active chip component is approximately equal to the area of the active chip component.

15 Claims, 5 Drawing Sheets

US 6,356,453 B1

ELECTRONIC PACKAGE HAVING FLIP CHIP INTEGRATED CIRCUIT AND PASSIVE CHIP COMPONENT

FIELD OF THE INVENTION

The present invention relates generally to electronic packaging. More particularly, the present invention relates to a multi-component electronic package.

BACKGROUND OF THE INVENTION

As is well known to those of skill in the art, electronic devices such as cellular telephones employed a variety of electronic components. Typically, these electronic components included active chip components as well as passive chip components. An active chip component such as an integrated circuit was capable of performing an action such as execution of an instruction. In contrast, a passive chip component such as a resistor, capacitor, or inductor possessed a specific electrical characteristic yet was incapable of performing an action.

The passive chip components were not readily integratable into the active chip components. To illustrate, it was not economical to form all required resistors, capacitors, or inductors in an integrated circuit chip. For this reason, the active chip component was packaged into a package, hereinafter referred to as an IC package. The IC package and the passive chip components were then attached to the printed circuit mother board separate from one another.

As the art moved to smaller, lighter weight and less expensive electronic devices, passive chip components were combined with active chip components in a single package. FIG. 1 is a cross-sectional view of a multi-component package 10 in accordance with the prior art.

Referring now to FIG. 1, package 10 included a laminate substrate 12 having an upper surface 12U and a lower surface 12L. Formed on upper surface 12U were a plurality of traces 14 and a die attach metallization 16. Formed on corresponding traces 14 were contacts 18. An upper solder mask 20 covered upper surface 12U of substrate 12 and traces 14 yet left contacts 18 and die attach metallization 16 exposed.

A lower surface 22L of an active chip component 22, e.g., an integrated circuit, was attached to upper surface 12U, and, more particularly, to die attach metallization 16, by adhesive 24. Bond pads 26 on an upper surface 22U of active chip component 22 were electrically connected to correspond contacts 18 by corresponding bond wires 28.

Terminals 30 of a passive chip component 32, e.g., a resistor, capacitor, or inductor, were electrically connected to corresponding contacts 18 by solder joints 34. In addition to forming the electrical connections between terminals 30 and the corresponding contacts 18, solder joints 34 also served to mount passive chip component 32 to substrate 12.

Active chip component 22 and passive chip component 32 were over molded in a layer of encapsulant 36. Layer of encapsulant 36 served to protect the electrical connections of package 10 as well as to protect package 10 from the ambient environment, e.g., moisture.

Traces 14 were electrically connected to corresponding traces 38 on lower surface 12L of substrate 12 by electrically conductive vias 40. Contacts 42 were formed on corresponding traces 38. A lower solder mask 44 covered lower surface 12L of substrate 12 and traces 38 yet left contacts 42 exposed.

Formed on contacts 42 were corresponding solder balls 46. As is well known to those of skill in the art, solder balls 46 were reflowed to attach and electrically connect package 10 to the printed circuit mother board. Solder joints 34 were formed of a solder having a higher melting temperature than that of solder balls 46 thus avoiding melting of solder joints 34 during reflow of solder balls 46. Solder balls 46 were arranged in an array format to form a ball grid array (BGA) package. Alternatively, a land grid array (LGA) or leadless chip carrier (LCC) package was formed.

By integrating passive chip component 32 with active chip component 22 into a single package 10, several advantages were realized as compared to attaching passive chip component 32 and active chip component 22 separately to the printed circuit mother board. One advantage was that less labor was required during component attachment to the printed circuit mother board. As a result, the cost of the electronic device employing package 10 was reduced. Another advantage was a reduction in final functional device size. However, when compared to a standard IC package containing only a single active chip component, package 10 was considerably larger, had reduced electrical performance and was significantly more expensive.

To minimize the cost associated with package 10, package 10 was often fabricated simultaneous with a plurality of packages 10 in an array format. FIG. 2 is a cross-sectional view of an array 50 of packages during fabrication in accordance with the prior art. Array 50 included a substrate 52. Substrate 52 included a plurality of individual substrates 12 integrally connected together. Substrate 52 was fabricated using well-known techniques.

Passive chip components 32 were then attached to each individual substrate 12. To illustrate, a first passive chip component 32A of the plurality of passive chip components 32 was attached to a first substrate 12A of the plurality of substrates 12.

To attach passive chip component 32A, solder paste was screened onto the appropriate contacts 18 on substrate 12A in a well-known manner. The solder paste included both solder and solder flux. Passive chip component 32A was positioned such that terminals 30 were aligned with and in contact with the screened solder paste. The screened solder paste was reflowed (melted) to mount passive chip component 32A to substrate 12A. The other passive chip components 32 were mounted to corresponding substrates 12 in a similar manner.

Since solder joints 34 were used to mount passive chip components 32 to corresponding substrates 12, a sufficient amount of solder paste had to be used to insure that solder joints 34 reliably mounted passive chip components 32. For the same reason, the solder flux of the solder paste was an aggressive, i.e., ionically active, solder flux.

Disadvantageously, the relatively large volume of solder paste contained a relatively large volume of aggressive solder flux. After mounting of passive chip components 32, a substantial amount of solder flux residue 52 from the solder flux remained. More particularly, solder flux residue 52 was left as a contaminant around solder joints 34 and on solder mask 20. Solder flux residue 52 was removed, e.g., using an aqueous cleaner.

FIG. 3 is a cross-sectional view of array 50 at a further stage during fabrication. Referring now to FIG. 3, active chip components 22 were attached to each individual substrate 12 by adhesives 24. To illustrate, a first active chip component 22A of the plurality of active chip components 22 was attached to first substrate 12A by a first adhesive 24A of the plurality of adhesives 24.

Bond pads 26 of active chip component 22A were then electrically connected to corresponding contacts 18 by corresponding bond wires 28. Bond pads 26 were wirebonded to contacts 18 by bond wires 28 sequentially. The other active chip components 22 were mounted and wirebonded in a similar manner. Typically, active chip components 22 were placed sequentially, adhesives 24 were cured, and bond pads 26 were sequentially wirebonded to contacts 18 by bond wires 28 for each active chip component 22.

FIG. 4 is a cross-sectional view of array 50 at a further stage during fabrication. Referring now to FIG. 4, a layer of encapsulant 56 was applied generally to cover an upper surface 52U of substrate 52. More particularly, layer of encapsulant 56 covered active chip components 22 including bond pads 26, bond wires 28, contacts 18, solder mask 20, passive chip components 32 including terminals 30 and solder joints 34. Illustratively, layer of encapsulant 56 was a liquid encapsulant formed using a liquid encapsulation process well known to those of skill in the art. Alternatively, layer of encapsulant 56 was a plastic encapsulant formed using a plastic encapsulation molded process also well known to those of skill in the art.

After formation and curing (if necessary) of layer of encapsulant 56, array 50 was singulated by cutting along singulation streets 60 resulting in a plurality of packages 10 (see FIG. 1, for example).

SUMMARY OF THE INVENTION

In accordance with the present invention, a package includes both a flip chip mounted active chip component and a passive chip component. By mounting the active chip component as a flip chip, several advantages are realized. One advantage is that the electrical performance of the package is improved compared to a conventional package having a wirebonded active chip component. More particularly, less impedance is associated with the flip chip bumps between the bond pads of the active chip component and the contacts on the substrate than that associated with conventional bond wires.

As the art moves towards higher speed active chip components, e.g., radio frequency (RF) integrated circuit components, it becomes increasingly important that the impedance associated with the package be minimized. Since the impedance of the package in accordance with the present invention is minimized, the package is well suited for use with higher speed active chip components.

Recall that in the prior art, a passive chip component was integrated with an active chip component into a single package. However, the incompatibility of the flip chip soldering process with the passive chip component soldering process required that the active chip component be wirebonded. Due to the relatively long length and relatively small diameter of a conventional bond wire, a relatively large impedance was associated with the bond wire. This relatively large impedance interfered with the propagation of the electrical signals to and from the active chip component. This interference was unacceptable depending on the application, e.g., in applications involving high frequency active chip components.

Further, by mounting the active chip component as a flip chip in accordance with the present invention, the area on the substrate occupied by the active chip component is reduced compared to the area occupied by a conventional wirebonded active chip component. More particularly, the contacts are formed within an area approximately equal to the area of the active chip component.

In contrast, to allow wire bonding, the contacts were fanned out around the perimeter of the active chip component in the prior art. Accordingly, the contacts necessarily occupied an area which was greater than the area of the active chip component.

Since the package in accordance with the present invention is formed to have a minimum size, the package is well suited for use with smaller, lighter weight and less expensive electronic devices.

Further, wirebonded active chip components of the prior art had an increased tendency to fail due to the so called "popcorn effect". As is well known to those of skill in the art, the die attach adhesive, which attached the active chip component to the substrate, had a tendency to absorb moisture. During attachment of the package to the print circuit mother board, this absorbed moisture had a tendency to expand due to heating. As a result, the active chip component was often damaged or destroyed resulting in failure of the package.

In stark contrast, the package in accordance with the present invention is formed without a die attach adhesive. Accordingly, the popcorn effect associated with conventional die attach adhesives is eliminated. As a result, the reliability of the package is greater than that of a package of the prior art.

To minimize the cost of the package, in one embodiment, the package is formed simultaneously with a plurality of packages. Solder joints are formed to mount passive chip components to an array type substrate, the array type substrate including a plurality of individual substrates integrally connected together. Since the solder joints form the physical mounting for the passive chip components, a substantial amount of solder paste is used resulting in the generation of a substantial amount of solder flux residue. After formation of the solder joints, the solder flux residue is removed.

Flip chip bumps form the electrical interconnections between the bond pads of the active chip components and the contacts on the array type substrate. However, since the flip chip bumps have minimal volume and are not primarily responsible for mounting the active chip components to the array type substrate, the flip chip bumps are formed using only a minimal amount of solder flux. Accordingly, the flip chip bumps are formed generating only a minimal amount of solder flux residue.

In one embodiment, the flip chip bumps are formed of a solder having a lower melting temperature than the solder of the solder joints. In this manner, the flip chip bumps are selectively melted and reflowed.

Thus, in accordance with the present invention, two previously incompatible soldering processes have been integrated into a single process. More particularly, the passive chip components are first soldered to the substrates using a residue generating soldering process followed by soldering of the active chip components using a minimal residue generating soldering process.

In one particular embodiment, a substrate has an upper surface having a first trace and a second trace formed thereon. A passive chip component has a first terminal and a solder joint electrically connects the first terminal to the first trace. An active chip component has a first surface with a bond pad formed thereon and a flip chip bump electrically connects the bond pad to the second trace.

In another embodiment, a substrate has an upper surface having a passive chip component trace and an active chip component trace formed thereon. A passive chip component has a surface with a first terminal formed thereon. A first contact is on the passive chip component trace and a solder joint electrically connects the first terminal to the first contact. An active chip component has a first surface with a bond pad formed thereon. A second contact is on the active chip component trace and a flip chip bump electrically connects the bond pad to the second contact such that the active chip component is mounted as a flip chip.

Also in accordance with the present invention, a method includes screening a solder paste onto a first contact on a first surface of a substrate. The solder paste includes a first solder and a first solder flux. A terminal of a passive chip component is aligned with the solder paste. The solder paste is melted to form a solder joint between the first contact and the terminal. Solder flux residue from the first solder flux is removed. A solder bump is formed on a bond pad on a first surface of an active chip component. The solder bump is aligned with a second contact on the first surface of the substrate. The solder bump is melted to form a flip chip bump between the second contact and the bond pad, where the solder joint does not melt during the melting of the solder bump.

In another embodiment, a method includes mounting a passive chip component to a substrate. A bond pad of an active chip component is aligned with a contact on the substrate. The active chip component is mounted as a flip chip on the substrate by forming a flip chip bump between the bond pad and the contact.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
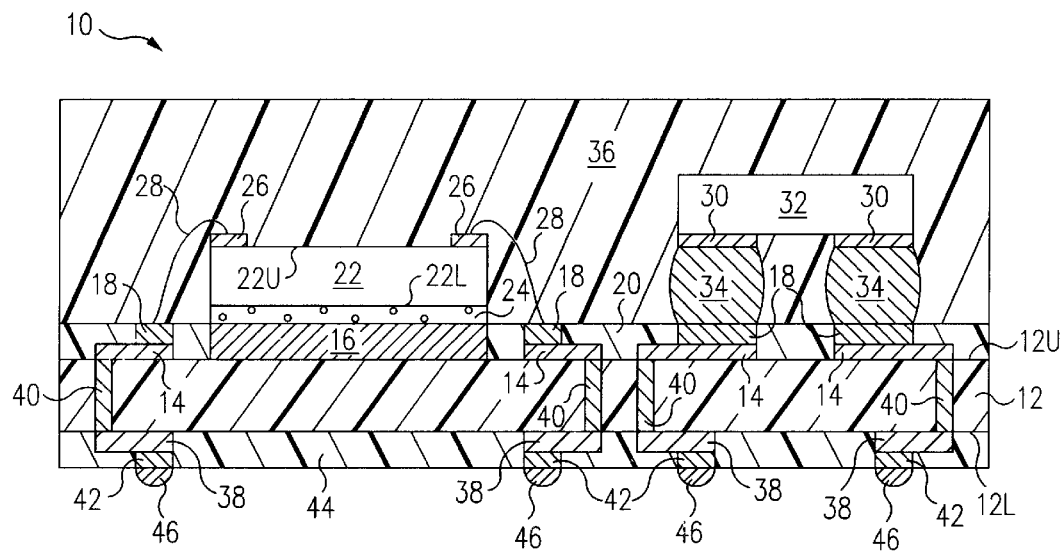
FIG. 1 is a cross-sectional view of a multi-component package in accordance with the prior art.

In accordance with the present invention, a package 500 (FIG. 5) includes both a flip chip mounted active chip component 522 and a passive chip component 532. By mounting active chip component 522 as a flip chip, several advantages are realized. One advantage is that the electrical performance of package 500 is improved compared to a conventional package having a wirebonded active chip component. More particularly, less impedance is associated with flip chip bumps 548 than that associated with conventional bond wires.

As the art moves towards higher speed active chip components, e.g., radio frequency (RF) integrated circuit components, it becomes increasingly important that the impedance associated with the package be minimized. Since the impedance of package 500 is minimized, package 500 is well suited for use with higher speed active chip components.

Recall that in the prior art, a passive chip component was integrated with an active chip component into a single package. However, the incompatibility of the flip chip soldering process with the passive chip component soldering process required that the active chip component be wirebonded. Due to the relatively long length and relatively small diameter of a conventional bond wire, (see bond wire 28 of FIG. 1, for example), a relatively large impedance was associated with the bond wire. This relatively large impedance interfered with the propagation of the electrical signals to and from the active chip component. This interference was unacceptable depending on the application, e.g., in applications involving high frequency active chip components.

Figure 5:
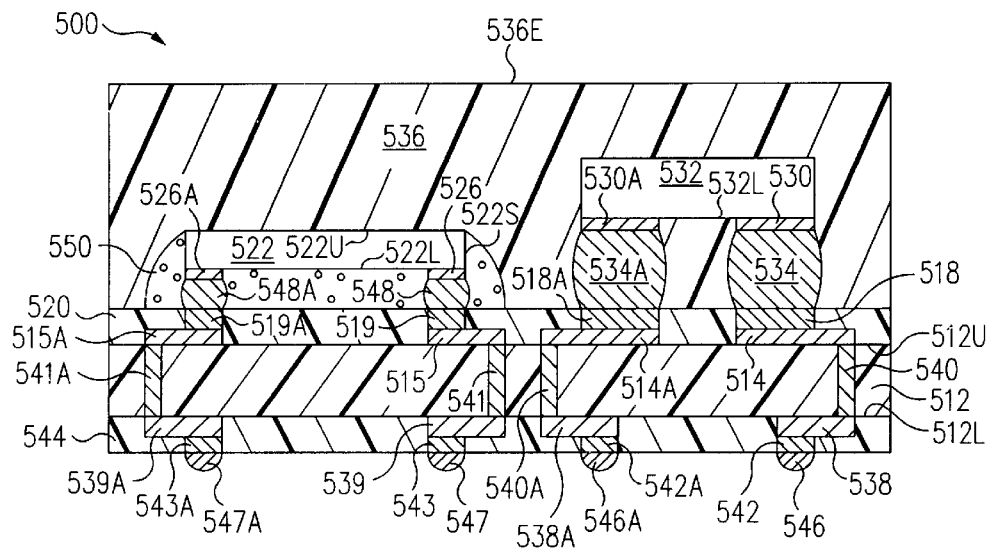
FIG. 5 is a cross-sectional view of a package in accordance with the present invention.

Further, by mounting active chip component 522 as a flip chip as shown in FIG. 5, the area on upper surface 512U of substrate 512 occupied by active chip component 522 is reduced compared to the area occupied by a conventional wirebonded active chip component. More particularly, contacts 519 are formed within an area approximately equal to the area of active chip component 522.

In contrast, to allow wire bonding, the contacts were fanned out around the perimeter of the active chip component in the prior art (see active chip component 22 and contacts 18 in FIG. 1, for example). Accordingly, the contacts necessarily occupied an area which was greater than the area of the active chip component.

Since package 500 in accordance with the present invention is formed to have a minimum size, package 500 is well suited for use with smaller, lighter weight and less expensive electronic devices.

Further, wirebonded active chip components of the prior art had an increased tendency to fail due to the so called "popcorn effect". As is well known to those of skill in the art, the die attach adhesive (see adhesive 24 of FIG. 1, for example), which attached the active chip component to the substrate, had a tendency to absorb moisture. During reflow of the solder balls (see solder balls 46 of FIG. 1, for example) during attachment of the package to the print circuit mother board, this absorbed moisture had a tendency to expand due to heating. As a result, the active chip component was often damaged or destroyed resulting in failure of the package.

In stark contrast, package 500 is formed without a die attach adhesive. Accordingly, the popcorn effect associated with conventional die attach adhesives is eliminated. As a result, the reliability of package 500 is greater than a package of the prior art.

To minimize the cost of package 500, in one embodiment (FIGS. 6, 7, 8 and 9), package 500 is formed simultaneously with a plurality of packages 500. Solder joints 534 are formed to mount passive chip components 532 (FIG. 7) to an array type substrate 610. Since solder joints 534 form the physical mounting for passive chip components 532, a substantial amount of solder paste is used resulting in the generation of a substantial amount of solder flux residue 752. After formation of solder joints 534, solder flux residue 752 is removed.

Figure 8:
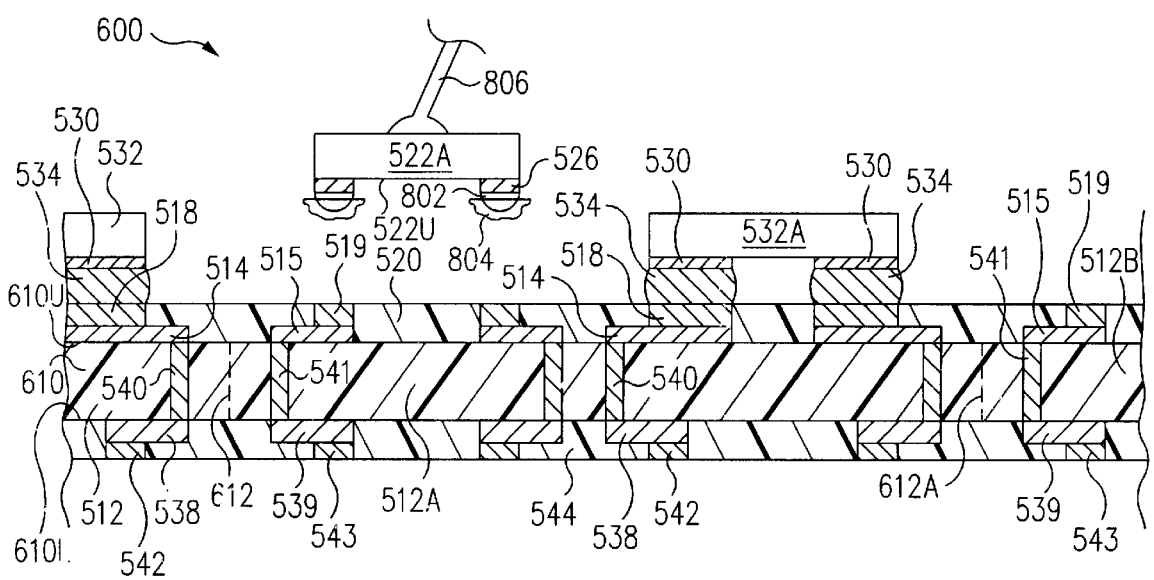
FIG. 8 is a cross-sectional view of the array of FIG. 7 at a further stage during fabrication.
Figure 9:
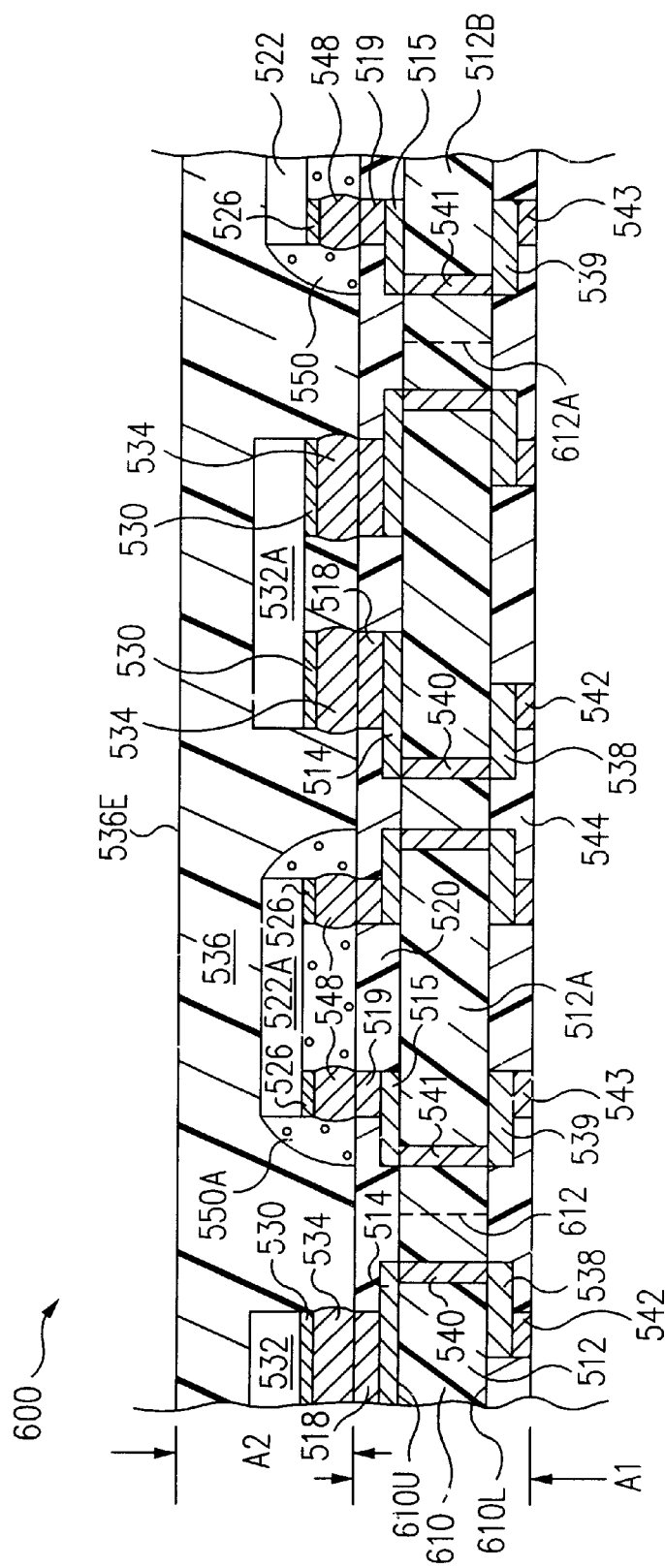
FIG. 9 is a cross-sectional view of the array of FIG. 8 at a further stage during fabrication.

Referring now to FIGS. 8 and 9 together, solder 802 (FIG. 8) is melted to form flip chip bumps 548 (FIG. 9), which form the electrical interconnections between bond pads 526 of active chip components 522 and contacts 519. However, since flip chip bumps 548 have minimal volume and are not primarily responsible for mounting active chip components 522 to substrates 512, flip chip bumps 548 are formed using only a minimal amount of solder flux. Accordingly, flip chip bumps 548 are formed generating only a minimal amount of solder flux residue.

In one embodiment, flip chip bumps 548 are formed of a solder having a lower melting temperature than the solder of solder joints 534. In this manner, flip chip bumps 548 are selectively melted and reflowed.

Thus, in accordance with the present invention, two previously incompatible soldering processes have been integrated into a single process. More particularly, passive chip components 532 are first soldered to substrates 512 using a residue generating soldering process followed by soldering of active chip components 522 using a minimal residue generating soldering process.

More particularly, FIG. 5 is a cross-sectional view of a package 500 in accordance with the present invention. Referring to FIG. 5, package 500 includes a substrate 512 having an upper, e.g., first, surface 512U and a lower, e.g., second, surface 512L. Illustratively, substrate 512 is printed circuit board, ceramic or tape, but is formed of other materials in other embodiments. Formed on upper surface 512U are a plurality of electrically conductive passive chip component, e.g., first, traces 514 (hereinafter traces 514) and a plurality of the electrically conductive active chip component, e.g., second, traces 515 (hereinafter traces 515).

Formed on traces 514 are electrically conductive contacts 518. Similarly, formed on traces 515 are electrically conductive contacts 519. An electrically insulative solder mask 520 covers upper surface 512U including traces 514, 515 yet leaves exposed contacts 518, 519.

Traces 514 are electrically connected to electrically conductive traces 538 on lower surface 512L of substrate 512 by electrically conductive vias 540. Similarly, traces 515 are electrically connected to electrically conductive traces 539 on lower surface 512L of substrate 512 by electrically conductive vias 541.

Formed on traces 538 are electrically conductive contacts 542. Similarly, formed on traces 539 are electrically conductive contacts 543. Formed on contacts 542 are electrically conductive interconnection balls 546, e.g., solder balls. Similarly, formed on contacts 543 are electrically conductive interconnection balls 547, e.g., solder balls. An electrically insulative solder mask 544 covers lower surface 512L including traces 538, 539 yet leaves exposed contacts 542, 543. However, in an alternative embodiment, solder mask 520 and/or solder mask 544 are not formed.

In the above description, contacts 518, traces 514, vias 540, traces 538, contacts 542 and interconnection balls 546 are set out as separate items from contacts 519, traces 515, vias 541, traces 539, contacts 543 and interconnection balls 547, respectively. However, in an alternative embodiment, contacts 518, traces 514, vias 540, traces 538, contacts 542 and interconnection balls 546 are formed during the same processing and are the same as contacts 519, traces 515, vias 541, traces 539, contacts 543 and interconnection balls 547, respectively.

A passive chip component 532, e.g., a resistor, capacitor or inductor, has a lower, e.g., first, surface 532L having electrically conductive terminals 530 formed thereon. Terminals 530 are electrically connected to corresponding contacts 518 and traces 514 by electrically conductive solder joints 534. To illustrate, a first terminal 530A of the plurality of terminals 530 is physically and electrically connected to a first contact 518A of the plurality of contacts 518 by a first solder joint 534A of the plurality of solder joints 534.

Contact 518A is formed on a first trace 514A of the plurality of traces 514. Trace 514A is electrically connected to a first trace 538A of the plurality of traces 538 by a first via 540A of the plurality of vias 540. A first contact 542A of the plurality of contacts 542 is formed on trace 538A. A first interconnection ball 546A of the plurality of interconnection balls 546 is formed on contact 542A. The other terminals 530, solder joints 534, contacts 518, traces 514, vias 540, traces 538, contacts 542, and interconnection balls 546 are electrically connected to one another in a similar manner and so are not discussed further to avoid detracting from the principals of the invention.

Electrically conductive bond pads 526 are formed on a lower, e.g., first, surface 522L of an active chip component 522 such as an integrated circuit. Bond pads 526 are electrically connected to corresponding contacts 519 by electrically conductive flip chip bumps 548, sometimes called bumps. Illustratively, flip chip bumps 548 are: (1) solder; (2) stud bumps, i.e., gold; (3) electrically conductive epoxy paste; or (4) electrically conductive epoxy film, as are well known to those of skill in the art.

Although a single active chip component 522 and a single passive chip component 532 are illustrated in FIG. 5, in light of this disclosure, those of skill in the art will understand that package 500 can contain more than one active chip component 522 and/or more than one passive chip component 532.

In this embodiment, an electrically insulative underfill material 550 encloses flip chip bumps 548 and fills the region between lower surface 522L of active chip component 522 and upper surface 512U of substrate 512 including solder mask 520. Further, underfill material 550 contacts sides 522S of active chip component 522. However, in an alternative embodiment, underfill material 550 does not contact sides 522S. In yet another alternative embodiment, underfill material 550 entirely encloses active chip component 522 and, more particularly, entirely contacts sides 522S and an upper, e.g., second, surface 522U of active chip component 522 opposite lower surface 522L.

By enclosing flip chip bumps 548, underfill material 550 environmentally protects flip chip bumps 548, e.g., from moisture. Further, underfill material 550 relieves stress on flip chip bumps 548, e.g., from stress generated due to differential thermal expansion between active chip component 522 and substrate 512. In this manner, underfill material 550 insures the reliability of package 500. However, in an alternative embodiment, underfill material 550 is not formed.

As set forth above, bond pads 526 are electrically connected to contacts 519 by flip chip bumps 548. To illustrate, a first bond pad 526A of the plurality of bond pads 526 is physically and electrically connected to a first contact 519A of the plurality of contacts 519 by a first flip chip bump 548A of the plurality of flip chip bumps 548.

Contact 519A is formed on a first trace 515A of the plurality of traces 515. Trace 515A is electrically connected to a first trace 539A of the plurality of traces 539 by a first via 541A of the plurality of vias 541. A first contact 543A of the plurality of contacts 543 is formed on trace 539A. A first interconnection ball 547A of the plurality of interconnection balls 547 is formed on contact 543A. The other bond pads 526, flip chip bumps 548, contacts 519, traces 515, vias 541, traces 539, contacts 543, and interconnection balls 547 are electrically connected to one another in a similar manner and so are not discussed further to avoid detracting from the principals of the invention.

Although particular electrically conductive pathways between terminal 530A and interconnection ball 546A and between bond pad 526A and interconnection ball 547A are set forth, those of skill in the art will recognize that other electrically conductive pathways can be formed. For example, substrate 512 is a multi-layered laminate substrate and, instead of straight through vias 540, 541, a plurality of electrically conductive traces on various layers in substrate 512 are interconnected by a plurality of electrically conductive vias to form the electrical interconnections between traces 514 and 538, traces 515 and 539, respectively. In another example, contacts 518, 519, 542 and/or 543 are not formed.

As a further example, interconnection balls 546, 547 are distributed in an array format to form a ball grid array (BGA) type package. Alternatively, interconnection balls 546, 547 are not formed, e.g., to form a metal land grid array (LGA) type package or a leadless chip carrier (LCC) type package. Other electrically conductive pathway modifications will be obvious to those of skill in the art.

Active chip component 522 and passive chip component 532 are over molded in a layer of encapsulant 536, sometimes called a mold cap. More particularly, layer of encapsulant 536 encloses active chip component 522, underfill material 550, passive chip component 532, terminals 530, solder joints 534, and a portion of solder mask 520. Layer of encapsulant 536 serves to protect the electrical connections of package 500 as well as to protect package 500 from the ambient environment, e.g., moisture. Further, layer of encapsulant 536 serves to dissipate thermal stresses in package 500, i.e., thermal stress generated as a result of differential thermal expansion between active chip component 522, passive chip component 532, and substrate 512. Layer of encapsulant 536 also serves to dissipate mechanical stress in package 500, e.g., layer of encapsulant 536 counteracts mechanical stress on active chip component 522 from underfill material 550.

Further, layer of encapsulant 536 has a smooth exposed upper, e.g., first, surface 536E. Advantageously, automated processing equipment, e.g., pick and place machines, are readily used to manipulate package 500 since such automated processing equipment readily attaches to smooth exposed upper surface 536E of layer of encapsulant 536. For example, a pick and place machine moves package 500 by attaching to smooth exposed upper surface 536E during back-end processing, e.g., during attachment of package 500 to the printed circuit mother board. Further, package 500 is readily marked on smooth exposed upper surface 536E, e.g., by laser or ink, to identify the part number associated with package 500.

Of importance, package 500 includes both active chip component 522 and passive chip component 532. Integrating both active chip component 522 and passive chip component 532 into package 500 reduces labor during component attachment to the printed circuit mother board and also reduces the final functional device size. Further, by testing package 500 for validity, i.e., to determine whether package 500 is defective or not, prior to attachment to the printed circuit mother board, testing at the printed circuit mother board assembly stage is reduced. As a result, reworking of the print circuit mother board is minimized.

Recall that in the prior art, a passive chip component was attached directly to the printed circuit mother board independent of the IC package, which contained the active chip component. Disadvantageously, this increased the complexity, and hence cost, of component attachment to the print circuit mother board as well as testing. Further, this precluded reductions in the printed circuit mother board size which, in turn, precluded reductions in the final functional device size.

Further, by electrically connecting bond pads 526 of active chip component 522 to corresponding contacts 519 by electrically conductive flip chip bumps 548, i.e., by mounting active chip component 522 as a flip chip, several additional advantages are realized. One advantage is that the electrical performance of package 500 is improved compared to a conventional package having a wirebonded active chip component. More particularly, less impedance is associated with flip chip bumps 548 than that associated with conventional bond wires.

As the art moves towards higher speed active chip components, e.g., radio frequency (RF) integrated circuit components, it becomes increasingly important that the impedance associated with the package be minimized. Since the impedance of package 500 is minimized, package 500 is well suited for use with higher speed active chip components.

Recall that in the prior art, a passive chip component was integrated with the active chip component into a single package. However, as discussed more fully below, the incompatibility of the flip chip soldering process with the passive chip component soldering process required that the active chip component be wirebonded. Due to the relatively long length and relatively small diameter of a conventional bond wire, (see bond wire 28 of FIG. 1, for example), a relatively large impedance was associated with the bond wire. This relatively large impedance interfered with the propagation of the electrical signals to and from the active chip component. This interference was unacceptable depending on the application, e.g., in applications involving high frequency active chip components.

Further, by mounting active chip component 522 as a flip chip, the area on upper surface 512U of substrate 512 occupied by active chip component 522 is reduced compared to the area occupied by a conventional wirebonded active chip component. More particularly, contacts 519 are aligned directly with corresponding bond pads 526. Accordingly, contacts 519 are formed within an area of upper surface 512U approximately equal to the area of lower surface 522L of active chip component 522.

In contrast, to allow wire bonding, the contacts were fanned out around the perimeter of the active chip component in the prior art (see active chip component 22 and contacts 18 in FIG. 1, for example). Accordingly, the contacts necessarily occupied an area on the upper surface of the substrate which was greater than the area of the active chip component.

Since package 500 in accordance with the present invention is formed to have a minimum size, package 500 is well suited for use with smaller, lighter weight and less expensive electronic devices.

Further, wirebonded active chip components of the prior art had an increased tendency to fail due to the so called "popcorn effect". As is well known to those of skill in the art, the die attach adhesive (see adhesive 24 of FIG. 1, for example), which attached the active chip component to the substrate, had a tendency to absorb moisture. During reflow of the solder balls (see solder balls 46 of FIG. 1, for example) during attachment of the package to the print circuit mother board, this absorbed moisture had a tendency to expand due to heating. As a result, the active chip component was often damaged or destroyed resulting in failure of the package.

In stark contrast, package 500 is formed without a die attach adhesive. Accordingly, the popcorn effect associated with conventional die attach adhesives is eliminated. As a result, the reliability of package 500 is greater than a package of the prior art.

Figure 6:
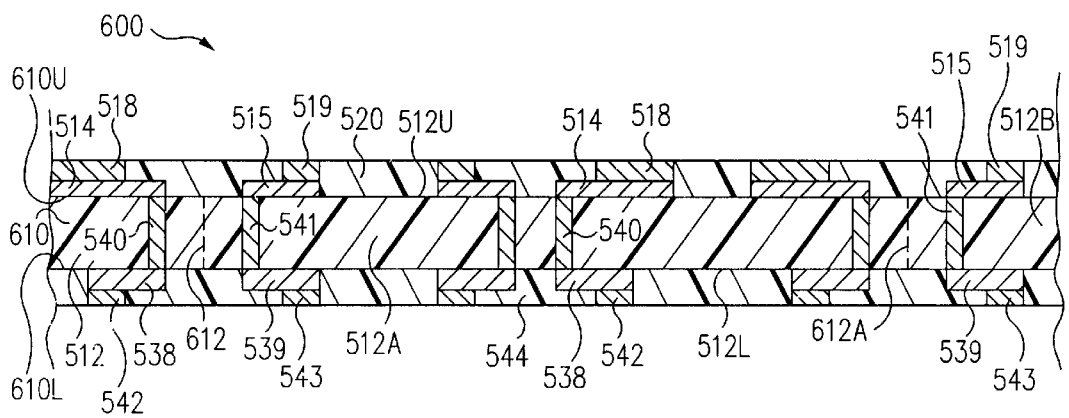
FIG. 6 is a cross-sectional view of an array of packages during fabrication in accordance with one embodiment of the present invention.

In one embodiment, to minimize the cost of package 500, package 500 is formed simultaneously with a plurality of packages 500. FIG. 6 is a cross-sectional view of an array 600 of packages during fabrication in accordance with one embodiment of the present invention.

Referring to FIG. 6, array 600 includes an array type substrate 610. Substrate 610 includes a plurality of individual substrates 512 integrally connected together in an array format, e.g., in a 2×2, 3×3, or 4×4 format, although other array formats are used in other embodiments. Each of substrates 512 is delineated by a singulation street 612, which is located between adjacent substrates 512. For example, a first singulation street 612A of the plurality of singulation streets 612 delineates a first substrate 512A of the plurality of substrates 512 from a second substrate 512B of the plurality of substrates 512. The other substrates 512 are similarly delineated from adjacent substrates 512 by corresponding singulation streets 612.

Substrates 512 include traces 514, 515 on upper surfaces 512U of substrates 512 and traces 538, 539 on lower surfaces 512L of substrates 512. Traces 514, 515 are electrically connected to corresponding traces 538, 539 by corresponding electrically conductive vias 540, 541, respectively, extending through substrates 512. Contacts 518, 519, 542, 543 are formed on corresponding traces 514, 515, 538, 539, respectively.

Traces 514, 515, 538, 539, vias 540, 541, and contacts 518, 519, 542, 543 are formed using any one of a number of techniques well known to those of skill in the art. For example, traces 514, 515, 538, 539 are formed by depositing and patterning an electrically conductive layer or, alternatively, by selectively depositing an electrically conductive layer. Illustratively, contacts 518, 519, 542, 543 are formed by plating an electrically conductive material on traces 514, 515, 538, 539, respectively. As a further example, vias 540, 541 are formed by drilling holes through substrates 512 and filling the holes with an electrically conductive material.

Solder masks 520, 544 are formed on an upper, e.g., first, surface 610U and on a lower, e.g., second, surface 610L, respectively, of substrate 610 using any one of a number of conventional techniques. For example, a photo resist is spin-coated on upper surface 610U and lower surface 610L and cured to form solder masks 520, 544.

Solder masks 520, 544 are patterned around contacts 518, 519 and contacts 542, 543 using a conventional photoimaging technique in which the spin-coated photo resist is selectively exposed to radiation to selectively cure the photo resist. Depending upon the type of photo resist, e.g., negative or positive, the exposed or unexposed photo resist is removed. Contacts 518, 519, 542, 543 are formed before, or, alternatively, after solder masks 520, 544 are formed. Alternatively, contacts 518, 519, 542, 543 and/or solder masks 520, 544 are not formed.

In one embodiment, when the pitch of traces 514, 515, 538, 539 becomes extremely small, e.g., less than 250 micrometers ($\mu$m), laser ablation is used to remove solder masks 520, 544 from contacts 518, 519 and contacts 542, 543, respectively. As used herein, pitch refers to the center to center spacing between adjacent traces 514, 515, 538, 539.

Figure 7:
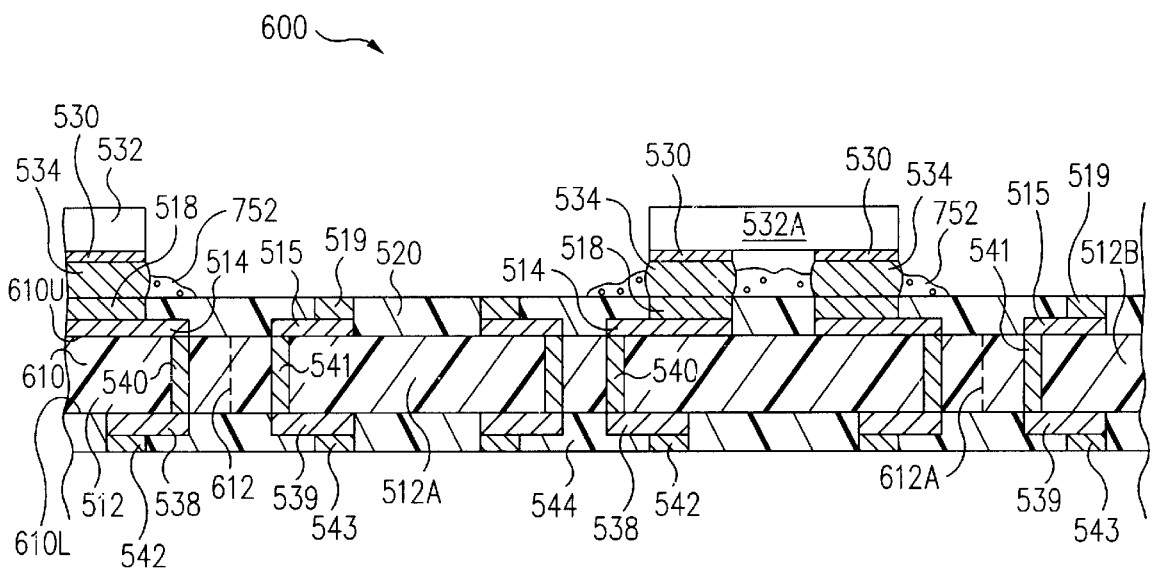
FIG. 7 is a cross-sectional view of the array of FIG. 6 at a further stage during fabrication.

FIG. 7 is a cross-sectional view of array 600 of FIG. 6 at a further stage during fabrication in accordance with this embodiment of the present invention. As shown in FIG. 7, passive chip components 532 are mounted to corresponding substrates 512. To illustrate, a first passive chip component 532A of the plurality of passive chip components 532 is mounted to substrate 512A.

To mount passive chip component 532A, in one embodiment, solder paste is applied, e.g., screened, onto contacts 518 on substrate 512A using any one of a number of conventional techniques. The solder paste includes a solder and a solder flux. Since the solder paste forms solder joints 534, which form the mounting for passive chip component 532A, a substantial amount of solder paste is used. For the same reason, the solder flux of the solder paste is an aggressive, i.e., ionically active, solder flux. For example, a high melting temperature lead free solder such as Indalloy # 121 (Sn-96.5%/Ag-3.5%) in a WMA-SMQ65 water-soluble based flux available from Indium Corporation of America is used as the solder paste.

Passive chip component 532A is positioned such that terminals 530 are aligned with, and in contact with, the solder paste. For example, passive chip component 532A is aligned using a pick and place machine in a conventional manner. Array 600 is then heated to melt the solder paste to form solder joints 534 as shown in FIG. 7. Illustratively, array 600 is heated to 235° C. with a tolerance of +5° C. to −0° C. for 15 to 30 seconds.

After formation of solder joints 534, a substantial amount of solder flux residue 752 from the solder flux remains. More particularly, due to the type of solder flux used, i.e., ionically active, as well as to the larger volume of solder flux used, solder flux residue 752 is formed during the melting of the solder paste and is left as a contaminant around solder joints 534 and on solder mask 520. Solder flux residue 752 is removed, e.g., using an aqueous cleaner.

FIG. 8 is a cross-sectional view of array 600 of FIG. 7 at a further stage during fabrication in accordance with this embodiment of the present invention. Referring now to FIG. 8, active chip components 522 are attached to corresponding substrates 512. To illustrate, a first active chip component 522A of the plurality of active chip components 522 is attached to substrate 512A.

In accordance with this embodiment, solder bumps 802 are formed on bond pads 526 of active chip component 522A. Solder flux 804 is applied to solder bumps 802, e.g., using a doctor blade application, as is well known to those of skill in the art. Of importance, solder flux 804 is only applied to solder bumps 802, i.e., is not applied to lower surface 522U of active chip component 522A. For example, the solder flux is NC-SMQ71TAC solder flux available from Indium Corporation of America.

A pick and place machine 806 positions active chip component 522A such that solder bumps 802 are aligned with, and in contact with, corresponding contacts 519.

FIG. 9 is a cross-sectional view of array 600 of FIG. 8 at a further stage during fabrication in accordance with this embodiment of the present invention. Referring now to FIGS. 8 and 9 together, array 600 is then heated to melt solder bumps 802 to form flip chip bumps 548 as shown in FIG. 9. Illustratively, array 600 is heated to 220° C. with a tolerance of +5° C. to −0° C. for 15 to 30 seconds. The other active chip components 522 are attached to the other corresponding substrates 512 in a similar manner.

Referring primarily to FIG. 8, solder bumps 802 are formed of a solder having a lower melting temperature than the solder of solder joints 534. To illustrate, the melting temperature of the solder of solder bumps 802 is approximately 183° C. while the melting temperature of the solder of solder joints 534 is approximately 220° C.

Accordingly, to reflow solder bumps 802 and form flip chip bumps 548 (FIG. 9), array 600 is heated to a temperature greater than the melting temperature of solder bumps 802 yet less than the melting temperature of solder joints 534. In this manner, solder bumps 802 are selectively melted and reflowed.

In certain instances, array 600 is heated to a temperature greater than the melting temperature of solder joints 534 to reflow bumps 802. However, by limiting the time of this heating, the thermal impedance of solder joints 534 prevents solder joints 534 from melting. For example, heating array 600 to 220° C. for 15 to 30 seconds selectively melts solder bumps 802 and not solder joints 534.

Figure 2:
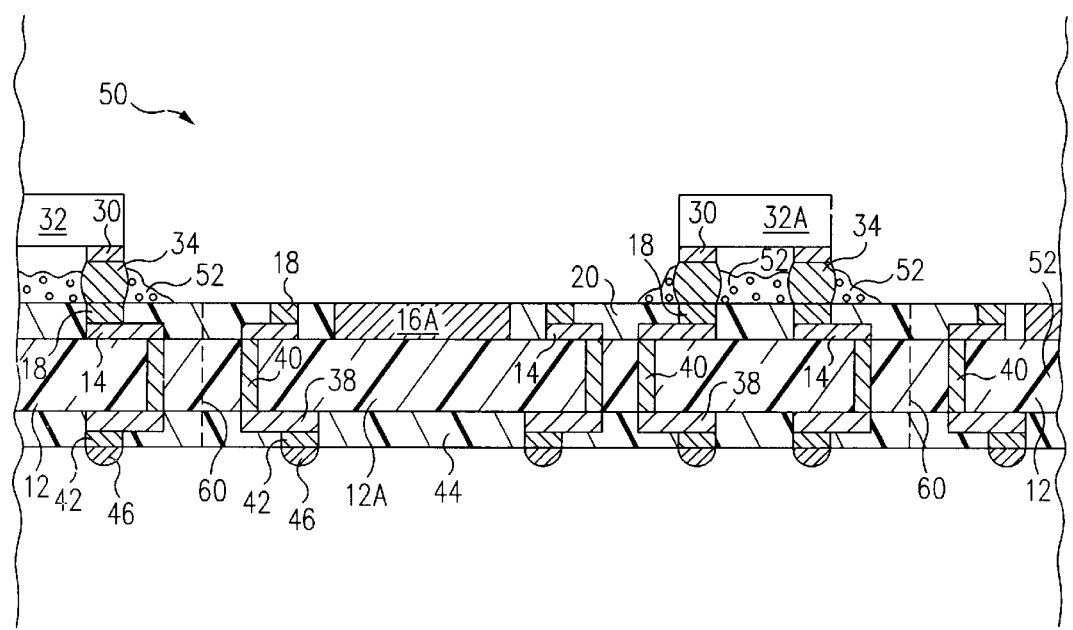
FIG. 2 is a cross-sectional view of an array of packages during fabrication in accordance with the prior art.
Figure 3:
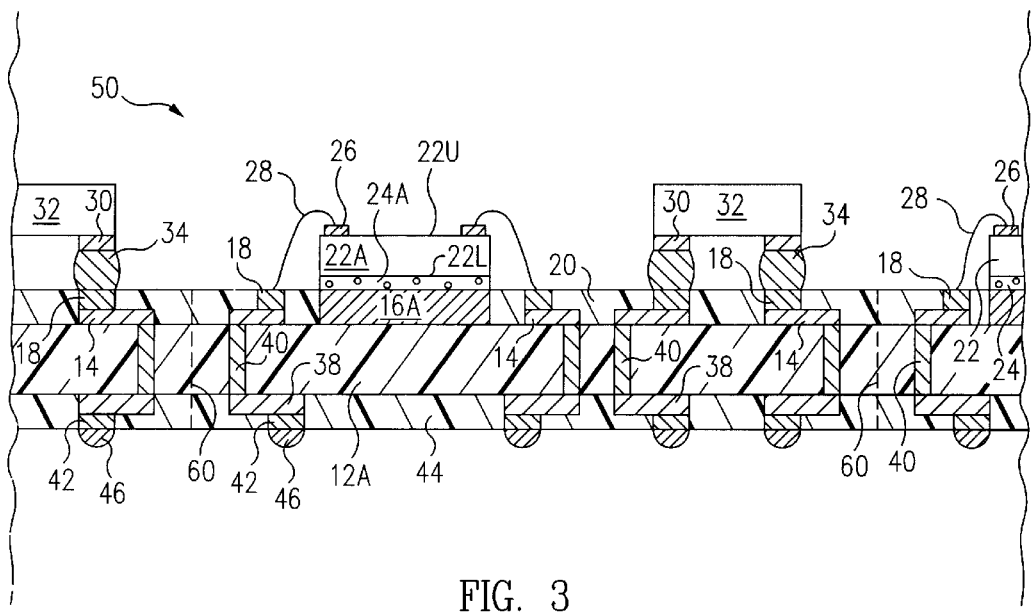
FIG. 3 is a cross-sectional view of the array of FIG. 2 at a further stage during fabrication.
Figure 4:
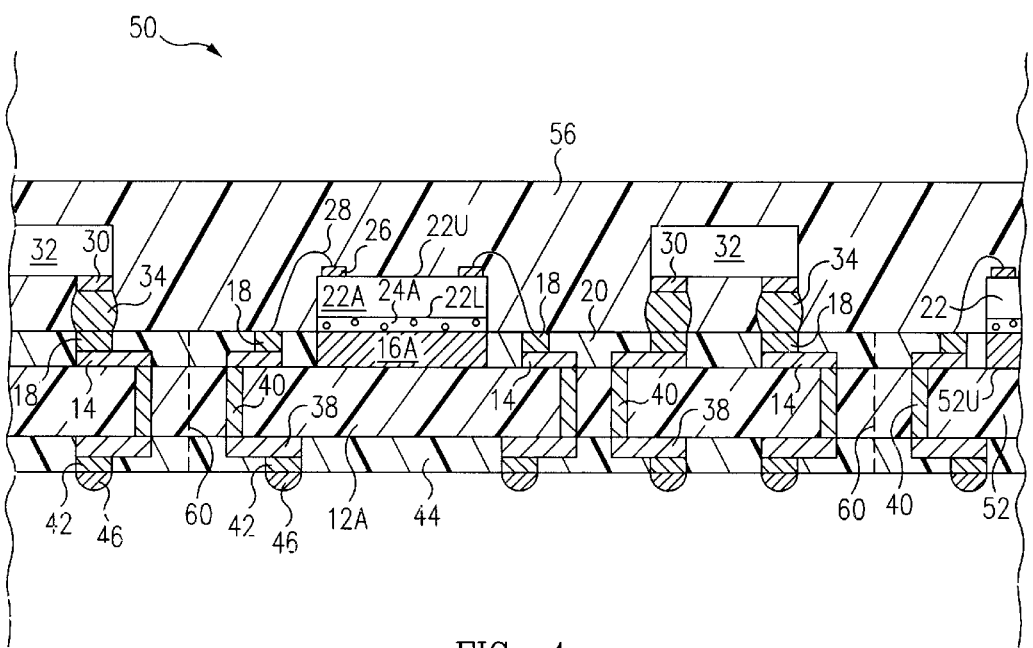
FIG. 4 is a cross-sectional view of the array of FIG. 3 at a further stage during fabrication.

In one embodiment, active chip components 522 are sequentially placed on corresponding substrates 512, and array 600 is heated to reflow all of solder bumps 802 simultaneously. By reflowing all of solder bumps 802 simultaneously, the time required for processing of array 600 in accordance with the present invention is reduced compared to the time required for processing of an array (see array 50 of FIGS. 2, 3 and 4 for example) in accordance with the prior art.

Recall that in the prior art (FIG. 3), active chip components 22 were attached to substrates 12 by adhesives 24. Bond pads 26 of active chip components 22 were then electrically connected to contacts 18 by bond wires 28 sequentially. Disadvantageously, forming bond wires 28 one at a time was labor intensive and time consuming, and hence substantially increased the cost of each package 10 of the prior art (see FIG. 1). Accordingly, package 500 (FIG. 5) in accordance with the present invention is fabricated at a substantially lower cost than package 10 (FIG. 1) in accordance with the prior art.

Referring still to FIGS. 8 and 9 together, flip chip bumps 548 form the electrical interconnections between bond pads 526 and contacts 519. However, in this embodiment, flip chip bumps 548 have minimal volume and are not primarily responsible for mounting active chip component 522A to substrate 512A. Consequently, less solder flux 804 is required to reflow solder bumps 802. Accordingly, flip chip bumps 548 are formed using only a minimal amount of solder flux.

For the same reason, a non-aggressive, i.e., ionically inactive, or medium aggressive solder flux is used. As is well known to those of skill in the art, non-aggressive or medium aggressive solder flux generates substantially less solder flux residue than an aggressive solder flux. As a result, essentially no solder flux residue exists after reflow of solder bumps 802 and formation of flip chip bumps 548.

Since there is no solder flux residue, there is no requirement to remove residue after reflow of solder bumps 802 and formation of flip chip bumps 548. Although it is set forth above that there is no solder flux residue generated, in light of this disclosure, those of skill in the art will understand that a minimal amount of solder flux residue may be generated. However, this minimal amount of solder flux residue is inconsequential, e.g., does not affect subsequent processing such as the application of an underfill material.

Thus, in accordance with the present invention, two previously incompatible soldering processes have been integrated into a single process. More particularly, passive chip components 532 are first soldered to substrates 512 using a residue generating soldering process, i.e., are surface mounted, followed by soldering of active chip components 522 using a minimal residue generating soldering process, i.e., are flip chip mounted.

Since all soldering was performed during a single soldering step, i.e., during a single heating, in the prior art and flip chip soldering was so significantly different than surface mount soldering that the two soldering processes could not be combined into a single soldering step, flip chip mounting of an active chip component was incompatible with surface mounting of a passive chip component in prior art.

In an alternative embodiment, instead of soldering active chip components 522 using a residue free soldering process: (1) stud bumps; (2) electrically conductive epoxy paste; or (3) electrically conductive epoxy film, are used, as those of skill in the art will understand.

Referring now to FIG. 9, a standard underfill material is applied, e.g., from a needle dispenser, around active chip components 522. As those of skill in the art will understand, capillary force between active chip components 522 and corresponding substrates 512 draws the underfill material between active chip components 522 and substrates 512 and around flip chip bumps 548. The underfill material is then cured, e.g., with heat, resulting in underfill materials 550 as shown in FIG. 9.

Advantageously, underfill materials 550 insure the reliability of flip chip bumps 548 and, more particularly, reduce or eliminate the possibility of failure of flip chip bumps 548. For example, underfill materials 550 reduce stress on flip chip bumps 548 generated as a result of differential thermal expansion between active chip components 522 and corresponding substrates 512. However, in an alternative embodiment, underfill materials 550 are not applied.

Any one of a number of conventional underfill materials can be used and the particular underfill material used is not critical to the invention. Examples of suitable underfill material include Dexter Hysol 4544 or FP4511 underfill material.

To illustrate, a first underfill material 550A of the plurality of underfill materials 550 is applied around active chip component 522A. Capillary force between active chip component 522A and substrate 512A draws underfill material 550A under active chip component 522A and around flip chip bumps 548. The other underfill materials 550 are applied around the other active chip components 522 in a similar manner, and then cured.

As shown in FIG. 9, a layer of encapsulant 536 is applied to cover upper surface 610 of substrate 610 including active chip components 522 and passive chip components 532. In one embodiment, a liquid encapsulant is applied and cured to form layer of encapsulant 536. In another embodiment, array 600 is placed in a mold and plastic encapsulant is transfer molded to form layer of encapsulant 536. Illustratively, dimension A1 is 0.48 mm and dimension A2 is 1.1 mm, although other dimensions are used in other embodiments.

Array 600 is then singulated by cutting along singulation streets 612 resulting in a plurality of packages 500 (FIG. 5). In one embodiment, array 600 is inverted from the view of FIG. 9 and placed on a tape, which supports array 600 during singulation, as those of skill in the art will understand. Advantageously, layer of encapsulant 536 has a smooth exposed surface 536E, which is readily and simply mounted to the tape.

Optionally, each package 500 is marked, e.g., with laser or ink, to identify the part number associated with package 500. As a further option, interconnection balls 546, 547 (see FIG. 5) are populated on corresponding contacts 542, 543, respectively. Typically, interconnection balls 546, 547 have a lower melting temperature, e.g., approximately 183° C., than solder joints 534, e.g., approximately 220° C., and may or may not having a lower melting temperature then flip chip bumps 548, e.g., approximate 183° C.

As a still further option, packages 500 are tested for validity, i.e., to determine whether each package 500 is defective or not. Marking of packages 500, testing of packages 500 and/or formation of interconnection balls 546, 547 occurs before singulation of array 600, or, alternatively, after singulation of array 600.

This application is related to Juskey et al., co-filed and commonly assigned U.S. patent application Ser. No. 09/608,357, entitled "FLIP CHIP INTEGRATED CIRCUIT AND PASSIVE CHIP COMPONENT PACKAGE FABRICATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A package comprising:
   a substrate having a first surface having a first trace and a second trace formed thereon;
   a passive chip component having a first terminal;
   a solder joint electrically connecting said first terminal to said first trace, said solder joint comprising a first solder;
   an active chip component having a first surface with a bond pad formed thereon; and
   a bump electrically connecting said bond pad to said second trace, said bump comprising a second solder having a lower melting temperature than said first solder.

2. The package of claim 1 wherein said active chip component is mounted as a flip chip.

3. The package of claim 1 further comprising an underfill material enclosing said bump and filling a region between said first surface of said active chip component and said first surface of said substrate.

4. The package of claim 3 wherein said underfill material contacts sides of said active chip component.

5. The package of claim 4 wherein said underfill material contacts a second surface of said active chip component opposite said first surface of said active chip component.

6. The package of claim 1 wherein said passive chip component is selected from the group consisting of a resistor, capacitor, and inductor.

7. The package of claim 1 wherein said active chip component is an integrated circuit.

8. The package of claim 7 wherein said active chip component is a radio frequency (RF) integrated circuit.

9. The package of claim 1 further comprising a first contact on said first trace, said solder joint being physically and electrically connected to said first contact.

10. The package of claim 1 further comprising a first contact on said second trace, said bump being physically and electrically connected to said first contact.

11. The package of claim 1 further comprising an array type substrate including a plurality of individual substrates integrally connected together in an array format, said plurality of individual substrates comprising said substrate.

12. A package comprising:
    a substrate having a first surface having a passive chip component trace and an active chip component trace formed thereon;
    a passive chip component having a surface with a first terminal formed thereon;
    a first contact on said passive chip component trace;
    a solder joint electrically connecting said first terminal to said first contact, said solder joint comprising a first solder;
    an active chip component having a first surface with a bond pad formed thereon;
    a second contact on said active chip component trace; and
    a bump electrically connecting said bond pad to said second contact such that said active chip component is mounted as a flip chip, said bump comprising a second solder having a lower melting temperature than said first solder.

13. A package comprising:
    a substrate having a first surface having a first trace and a second trace formed thereon;
    a passive chip component having a first terminal;
    a solder joint electrically connecting said first terminal to said first trace;
    an active chip component having a first surface with a bond pad formed thereon;
    a bump electrically connecting said bond pad to said second trace;
    an underfill material enclosing said bump and filling a region between said first surface of said active chip component and said first surface of said substrate; and
    a layer of encapsulant enclosing said active chip component, said passive chip component, said underfill material, and said solder joint.

14. The package of claim 13 wherein said bump is selected from the group consisting of solder, gold, electrically conductive epoxy paste, and electrically conductive epoxy film.

15. The package of claim 13 wherein said layer of encapsulant has a smooth exposed first surface.

\* \* \* \* \*